(12) United States Patent
Trivedi

(10) Patent No.: US 11,869,607 B2
(45) Date of Patent: *Jan. 9, 2024

(54) MEMORY LOCATION AGE TRACKING ON MEMORY DIE

(71) Applicant: Micron Technology, Inc., Boise, ID (US)

(72) Inventor: Falgun G. Trivedi, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/838,873

(22) Filed: Jun. 13, 2022

(65) Prior Publication Data

US 2022/0328110 A1  Oct. 13, 2022

Related U.S. Application Data

(63) Continuation of application No. 17/116,789, filed on Dec. 9, 2020, now Pat. No. 11,361,837.

(51) Int. Cl.
  *G11C 16/06* (2006.01)
  *G11C 16/34* (2006.01)

(52) U.S. Cl.
  CPC .................. *G11C 16/349* (2013.01)

(58) Field of Classification Search
  CPC ....................................... G11C 16/349
  USPC .................................... 365/185.09
  See application file for complete search history.

(56) References Cited

U.S. PATENT DOCUMENTS

| 10,552,085 | B1 | 2/2020 | Chen et al. |
| 11,361,837 | B1 * | 6/2022 | Trivedi ............... G11C 5/148 |
| 2011/0075482 | A1 | 3/2011 | Shepard et al. |
| 2011/0299317 | A1 | 12/2011 | Shaeffer et al. |
| 2016/0099078 | A1 | 4/2016 | Luo et al. |

(Continued)

FOREIGN PATENT DOCUMENTS

| CN | 105874540 | 8/2016 |
| CN | 105989875 | 10/2016 |
| CN | 114613413 | 6/2022 |

OTHER PUBLICATIONS

"Chinese Application Serial No. 202111484256.0, Voluntary Amendment filed Sep. 28, 2022", with English claims, 19 pages.

(Continued)

*Primary Examiner* — Hoai V Ho
(74) *Attorney, Agent, or Firm* — Schwegman Lundberg & Woessner, P.A.

(57) ABSTRACT

Various embodiments enable age tracking of one or more physical memory locations (e.g., physical blocks) of a memory die, which can be from part of a memory device. In particular, various embodiments provide age tracking of one or more physical memory locations of a memory die (e.g., memory integrated circuit (IC)) using one or more aging bins on the memory die, where each aging bin is associated with a different set of physical memory locations of the memory die. By use of an aging bin for a set of physical memory locations, various embodiments can enable a processing device that interacts with a memory die, after the memory die has been subjected to one or more reflow soldering processes, to determine how much the set of physical memory locations have aged after the one or more reflow soldering processes.

20 Claims, 9 Drawing Sheets

(56) References Cited

U.S. PATENT DOCUMENTS

2021/0318801 A1 10/2021 Benisty et al.
2022/0180947 A1 6/2022 Trivedi

OTHER PUBLICATIONS

"Chinese Application Serial No. 202111484256.0, Office Action dated Nov. 15, 2022", with English translation, 9 pages.
U.S. Appl. No. 17/116,789 U.S. Pat. No. 11,361,837, Dec. 9, 2020, Memory Location Age Tracking on Memory Die.

* cited by examiner

MEMORY LOCATION AGE TRACKING ON MEMORY DIE

PRIORITY APPLICATION

This application is a continuation of U.S. application Ser. No. 17/116,789, filed Dec. 9, 2020, which is included herein by reference in its entirety.

TECHNICAL FIELD

Embodiments of the disclosure relate generally to memory devices and, more specifically, to tracking age of one or more physical memory locations on a memory die, which can form part of a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
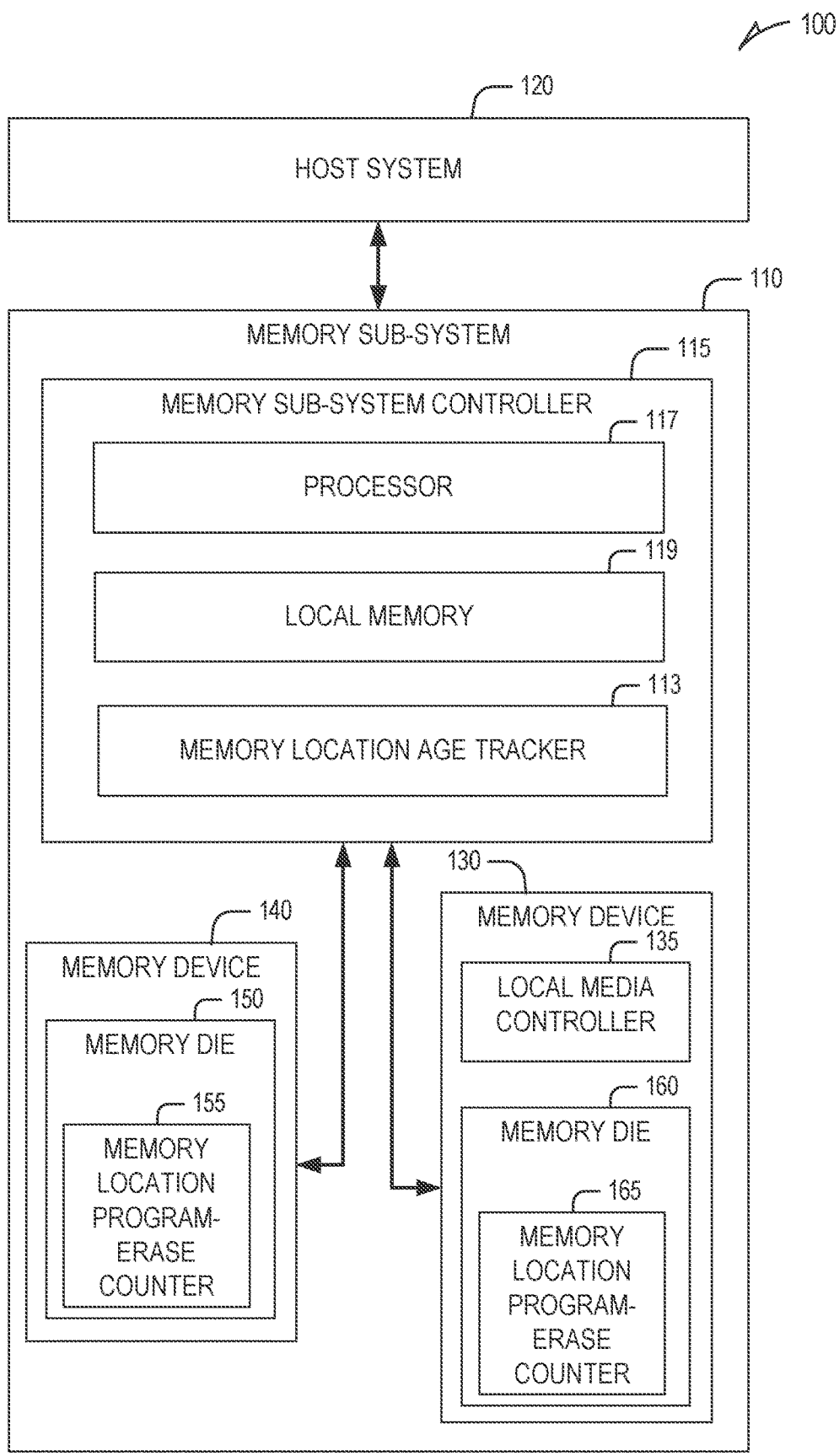
FIG. 1 is a block diagram illustrating an example computing system that includes a memory sub-system, in accordance with some embodiments of the present disclosure.

Aspects of the present disclosure are directed to tracking age of one or more physical memory locations (e.g., physical blocks) of a memory die (e.g., memory integrated circuit (IC)), which can be form part of a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error-correcting code (ECC) codeword, parity code), data version (e.g., used to distinguish age of data written), valid bitmap (which LBAs or logical transfer units contain valid data), and so forth.

The memory sub-system can initiate media management operations, such as a write operation, on host data that is stored on a memory device. For example, firmware of the memory sub-system may re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical memory address mapping table (also referred to herein as a L2P table), data from logging, scratch pad data, and so forth).

A memory device can be a non-volatile memory device. A non-volatile memory device is a package of one or more die. Each die can be comprised of one or more planes. For some types of non-volatile memory devices (e.g., negative-and (NAND)-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package.

For certain hardware applications, such as those relating to embedded, mobile, and automotive markets, a memory die can be preloaded with user data (also referred to as herein as preloaded data), such as firmware, operating system data, application data, and the like, prior to the memory die (e.g., NAND-type or NOR-type memory die) being solder mounted to a printed circuit board that is used in a device (e.g., tablet, smart phone, navigation system, and the like). For example, the printed circuit board can be a memory device or memory sub-system (e.g., solid state drive or managed NAND memory device) used by a computing device. However, the data integrity of the preloaded data stored on the memory die can be impacted due to charge loss caused by one or more reflow soldering processes the memory die is subjected to after the memory die is mounted to the printed circuit board. The reflow soldering processes (performed after the memory die has been mounted) can be, for example, to mount one or more additional components to the printed circuit board or to rework certain components of the printed circuit board. During this period of time, a conventional memory die is unable to track how many reflow soldering processes it has been subjected to, or how much those reflow soldering processes have impacted the charge facilitating storage of the preloaded data on the memory die. The number of reflow soldering processes (also referred to as a reflow profile) can vary between applications.

Aspects of the present disclosure address the above and other deficiencies by versioning data stored on a memory device. In particular, various embodiments provide age tracking of one or more physical memory locations (e.g., physical blocks) of a memory die (e.g., memory integrated circuit (IC)) using one or more aging bins on the memory die, where each aging bin is associated with a different set of physical memory locations of the memory die. By use of an aging bin for a set of physical memory locations, various embodiments described herein can enable a processing device (e.g., of a memory sub-system controller or a media controller) that interacts with a memory die, after the memory die has been subjected to one or more reflow soldering processes, to determine how much the set of physical memory locations have aged after the one or more reflow soldering processes. The post-reflow age tracking provided by some embodiments can be used by the processing device to determine, for example: a remaining lifespan (e.g., likelihood of failure) of the one or more physical memory locations; a voltage level threshold (e.g., read offset, or offset voltage) for reading stored data (e.g., data preloaded on the memory die prior to reflow soldering) from the one or more physical memory locations; or a refresh criteria for the one or more physical memory locations (which can determine how often data stored on the one or more physical memory locations is refreshed). For some embodiments, the post-reflow age tracking can be used where one or more physical memory locations store data preloaded onto the memory die (e.g., during manufacturing) prior to the memory die being solder mounted on a printed circuit board (PCB) (e.g., memory device PCB) or prior to any reflow soldering processes being applied to the memory die. The preloaded data can include, without limitation, firmware data, operating system data, map data, preloaded mobile applications or software application data, and the like. For example, the memory die can be preloaded with data useful to a mobile device, such as a smart phone, prior to the memory die being solder mounted onto a printed circuit board that is integrated into the mobile device.

According to some embodiments, aging bins on a memory die are used a controller external to the memory die, such as a memory sub-system controller or a local media controller of a memory device, to optimize read offsets for physical memory locations (e.g., blocks) being used to store user data, such as preloaded data stored on the physical memory locations. For instance, the controller can determine (e.g., measure) a charge loss value (e.g., −100 mV, −200 mV, −300 mV, etc.) of an aging bin associated with a set of physical memory locations, and determine a voltage level threshold (e.g., read offset), a refresh criterion, or both for the set of physical memory locations. For instance, based on the charge loss value of the aging bin, the controller can obtain a voltage level threshold (e.g., read offset) or a refresh criterion from pre-characterization data for the memory die.

For some embodiments, the pre-characterization data is stored external to the memory die, and accessible to the controller external to the memory die. The pre-characterization data for a memory die can comprise data that associates (e.g., maps) a given charge loss value or range of charge loss values (of an aging bin) to one or more of the following: a voltage level threshold (e.g., pre-assigned read offsets) for a set of physical memory locations; a refresh criterion for a set of physical memory locations; or a number of reflow soldering processes (e.g., cycles) applied to the memory die.

The following Table 1 illustrates an example of pre-characterization data for a memory die. As shown, the pre-characterization data describes an association of charge loss values with aging bin grades (with A being the best grade), refresh criteria, and number of reflows. For illustrative purposes, a charge loss value greater than −500 mV for an aging bin of a memory bin represents a condition where an associated set of physical memory locations (e.g., blocks) of the memory bin is storing data that is either unreadable or at risk of being unreadable in view of a specification for the memory die (e.g., the amount of charge loss surpasses a minimum level of charge needed for operation of the memory die, per its specification).

TABLE 1

| # of Reflows | Charge Loss Value | Aging Bin Grade | Read Offset | Refresh Criterion |
|---|---|---|---|---|
| 1 | −100 mV | A | Voltage Level 1 | <5 year |
| 2 | −200 mV | B | Voltage Level 2 | <4 year |
| 3 | −300 mV | C | Voltage Level 3 | <3 year |
| 4 | −400 mV | D | Voltage Level 4 | <2 year |
| 5 | −500 mV | E | Voltage Level 5 | <1 year |
| 6 | >−500 mV | Flag (charge loss surpasses spec minimum) | Flag (charge loss surpasses spec minimum) | Recover data now |

By using various embodiments, performance and data retention capability of a memory die, used in a memory sub-system or a memory device, can be improved. These improvements can be particularly useful for data that is preloaded on (e.g., stored) on a memory die prior to the memory die being mounted onto a printed circuit board and being subjected to one or more reflow soldering processes.

As used herein, a physical memory location of a memory die can comprise a block, a page, or a memory cell. For instance, where a physical memory location comprises a page or a memory cell, a set of physical memory locations can represent a single block or multiple blocks. The set of physical memory locations can be a set of contiguous physical memory locations. As used herein, storing data on one or more physical memory locations of a memory die can comprise writing data to the one or more physical memory locations, where the writing can comprise programming one or more pages of a block with the data. As used herein, an aging bin can comprise one or more physical memory locations of a memory die, such as one or more blocks (e.g., blocks of single-level cells (SLCs), or SLC blocks) of the memory die. Additionally, as used herein, an aging bin comprising a SLC block can be referred to as a SLC aging bin. An SLC block used as part of an aging bin can be different from a SLC block that is used for storing user data, such as a portion of preloaded data. For some embodiments, a set of physical memory locations used to store user data (e.g., preloaded data) comprises one or more SLC blocks, multi-level cell (MLC) blocks, triple-level cell (TLC)

blocks, or quad-level cell (QLC) blocks, while an aging bin associated with the set of physical layer comprises one or more SLC blocks.

As used herein, a program-erase count (for a set of physical memory locations) can be expressed as a number of cycles performed to either write data or erase data with respect to the set of physical memory locations. For instance, the program-erase count can comprise a program-erase cycle count. As used herein, a reflow soldering process can be performed, at least in part, using a reflow oven or similar apparatus. As used herein, a voltage charge distribution can comprise a plurality of data points, each of which indicate a number of physical memory locations (e.g., number of memory cells) per a measured voltage charge. As used herein, a voltage level threshold can comprise, a read offset, or an offset voltage. Additionally, as used herein, a refresh process can comprise a data refresh process for refreshing data stored on a physical memory location (e.g., a memory cell) of a memory die. As used herein, charge distribution and voltage distribution can be used interchangeably.

Disclosed herein are some examples of tracking age of one or more physical memory locations on a memory die, as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a SATA interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLCs), can store one bit per cell. Other types of memory cells, such as multi-level cells (MLCs), TLCs, quad-level cells (QLCs), and penta-level cells (PLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

As used herein, a block comprising SLCs can be referred to as a SLC block, a block comprising MLCs can be referred to as a MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical memory address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

Each of the memory device 130, 140 include a memory die 150, 160 implementing age tracking as described herein. For some embodiments, each of the memory devices 130, 140 represents a memory device that comprises a printed circuit board, upon which its respective memory die 150, 160 is solder mounted. Each of the memory dies 150, 160 may have been subjected to one or more reflow soldering processes as a result of being solder mounted onto a printed circuit board. For some embodiments, one or both of the memory dies 150, 160 are storing preloaded data (e.g., firmware, operating system, map data, etc.) that was loaded onto the memory die prior to the memory die being subjected to one or more reflow soldering processes.

Each of the memory dies 150, 160 includes a memory location program-erase counter 155, 165, which can represent logic or a controller. For some embodiments, each of the memory location program-erase counters 155, 165 enables its respective memory die to perform one or more of the following: maintain one or more aging bins (e.g., SLC aging blocks) on the memory die in association with individual sets of physical memory locations (e.g., SLC, MLC, TLC, QLC blocks used to store preloaded data) of the memory die; track a program-erase count for each of the individual sets of physical memory locations; store program erase counts in a respective aging bin; and provide one or more program erase counts from aging bins to a processing device or controller external to the memory die, such as to the memory sub-system controller 115 or the local media controller 135 (in the case of the memory die 160). For example, based on the memory location program-erase counter 165, the memory die 160 can provide one or more program erase counts stored on its aging bins, to the memory sub-system controller 115 or the local media controller 135, as part of a handshake process between the memory die 160 and the memory sub-system controller 115/the local media controller 135, which can be performed automatically when the memory die 160 is powered on. For some embodiments, where data is preloaded on one or more of the memory dies 150, 160 prior to one or more reflow soldering processes being applied to the memory dies 150, 160, the program-erase counts associated with (e.g., corresponding to) physical memory locations that store the preloaded data can reflect (e.g., can be updated to reflect) the data write and erase operations performed on those of physical memory locations (to facilitate storage of the preloaded data).

The memory sub-system controller 115 includes a memory location age tracker 113 that enables or facilitates the memory sub-system controller 115 to use age tracking features described herein with respect to one or both of the memory dies 150, 160. Alternatively, some or all of the memory location age tracker 113 is included by the local media controller 135, thereby enabling the local media controller 135 to use age tracking features with respect to the memory die 160. Based on the memory location age tracker 113, the memory sub-system controller 115 can determine an age of a set of physical memory locations (e.g., blocks) of the memory dies 150, 160 based on an aging bin associated with the set of physical memory locations. The memory location age tracker 113 can enable the memory sub-system controller 115 to determine a charge loss value of an aging bin associated with a set of physical memory locations of a memory die (e.g., 150, 160) and, based on the determined charge loss value, determine a voltage level threshold for reading data from the set of physical memory locations or a refresh criterion for refreshing data stored on the set of physical memory locations. For instance, to determine the voltage level threshold or the refresh criterion, the memory location age tracker 113 can enable the memory sub-system controller 115 to access pre-characterization data for each of the memory dies 150, 160. Depending on the embodiment, the pre-characterization data can comprise data that associates (e.g., maps) a given charge loss value or range of charge loss values (of an aging bin) to one or more of the following: a voltage level threshold (e.g., pre-assigned read offsets) for a set of physical memory locations; a refresh criterion for a set of physical memory locations; or a number of reflow soldering processes (e.g., cycles) applied to the memory die. For some embodiments, the pre-characterization data is stored external to the memory dies 150, 160 (e.g., the local memory 119), and accessible to the memory sub-system controller 115 to the memory die. An example pre-characterization data is illustrated herein by Table 1.

FIGS. 2 through 6 are flow diagrams of example methods for tracking age of a set of physical memory locations of a memory die, in accordance with some embodiments of the present disclosure. The methods 200, 300, 400, 500, 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more operations of the methods 200 or 300 are performed as a process for manufacturing a printed circuit board with a memory die (e.g., 150, 160), while any remaining operation of the methods 200 or 300 are performed by the memory sub-system controller 115 of FIG. 1 based on the memory location age tracker 113 or by the local media controller 135 of FIG. 1. In some embodiments, at least one of the methods 400, 500, 600 is performed by the memory sub-system controller 115 of FIG. 1 based on the memory location age tracker 113. Additionally, or alternatively, for some embodiments, at least one of the methods 200, 300, 400, 500, 600 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Figure 2:
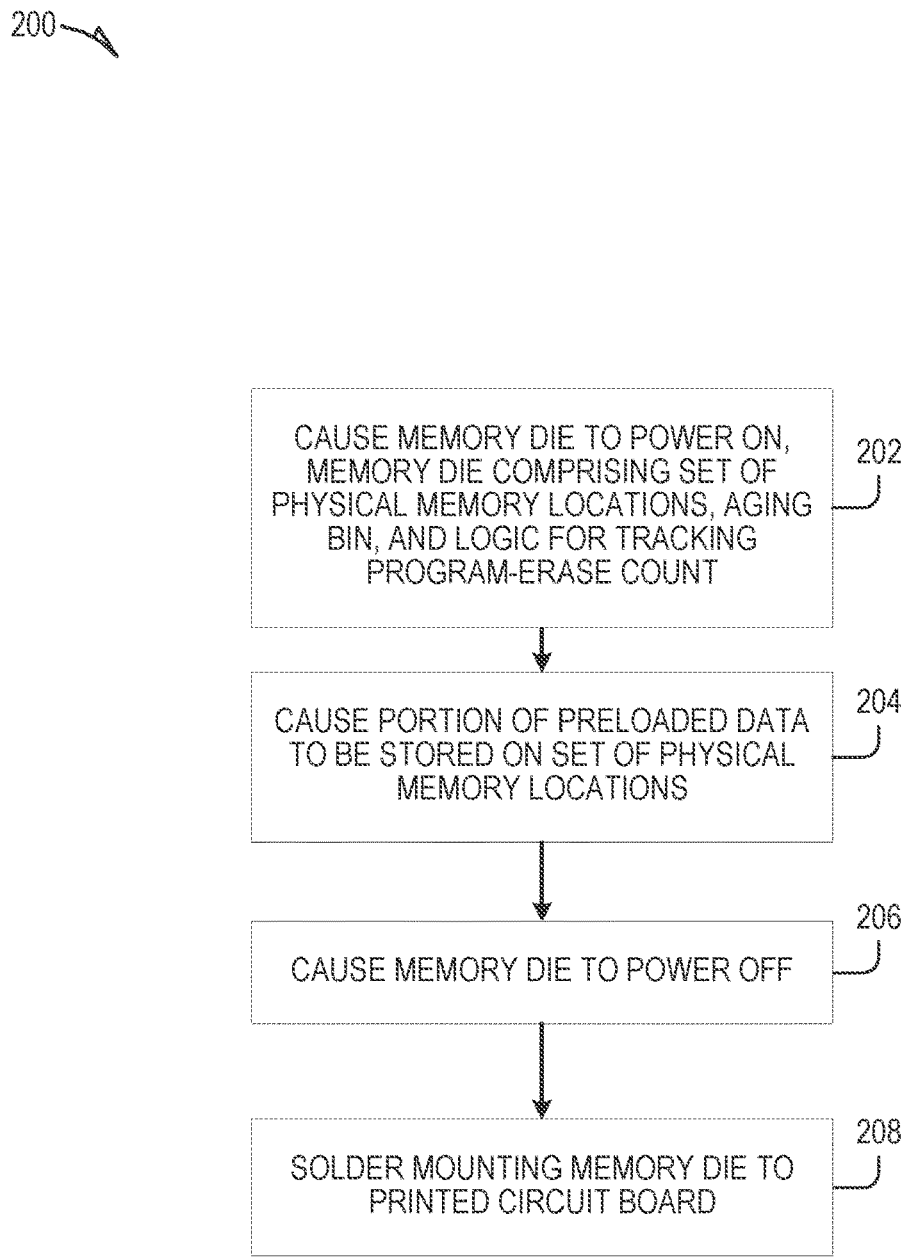
FIGS. 2 through 6 are flow diagrams of example methods for tracking age of a set of physical memory locations of a memory die, in accordance with some embodiments of the present disclosure.

Referring now to the method 200 of FIG. 2, the method 200 illustrates an example of preparing a memory die (e.g., 150, 160) for age tracking and mounting the memory die to a printed circuit board (e.g., of the memory device 130, 140), in accordance with some embodiments. For some embodiments, the method 200 is performed as part of a manufacturing process that assembles one or more components with a printed circuit board (e.g., a memory device printed circuit board). For example, the method 200 can be performed by a party that manufactured the memory die (hereafter, referred to as a manufacturer or manufacturing party), or can be performed by a downstream party, such as a party that receives a memory die (e.g., from a die manufacturer) and mounts the received memory die (and other components) onto a printed circuit board.

At operation 202, an apparatus coupled to a memory die (e.g., 150, 160), such as a memory die testing apparatus, causes the memory die to power on. Operation 202 can be performed after the memory die has been manufactured but prior to the memory die being subjected to a reflow soldering process. For some embodiments, memory die comprises a set of physical memory locations (e.g., one or more blocks), and an aging bin associated with the set of physical memory locations, where the aging bin comprises one or more physical memory locations (e.g., one or more blocks) of the memory die. For instance, the aging bin can comprise one or more SLC blocks, and the set of physical memory locations can comprise a set of SLC, MLC, TLC, or QLC blocks. For some embodiments, one or more SLC blocks are used for the aging bin, which can provide high signal-to-noise ratio for voltage/charge detection purposes. After performing one or more reflow soldering processes on the memory die, the voltage/charge detection can be used for measuring a voltage distribution of the aging bin and determining a charge loss value for the aging bin accordingly.

For some embodiments, the memory die (e.g., 150, 160) comprises a logic (e.g., the memory location program-erase counter 155,165) for tracking a program-erase count for the set of physical memory locations, where the program-erase count describes a number of times data has been written to or erased from the set of physical memory locations. For various embodiments, the program-erase count for the set of physical memory locations is stored on the aging bin. The storage of the program-erase count on the aging bin can cause the aging bin to a have a charge distribution prior to the memory die being subjected to one or more reflow soldering process. For various embodiments, one or more reflow soldering processes applied to the memory die causes charge loss for the aging bin, where the more reflow soldering processes performed on the memory die, the more the charge loss the aging bin experiences. After the memory die is mounted to a printed circuit board and subjected to one or more reflow soldering processes, the charge distribution can eventually be used by a subsequent operation/process to determine a charge loss value of the aging bin after the memory die has been subjected to one or more reflow soldering processes. Further, as described herein, the program-erase count stored on the aging bin can eventually be used by some embodiments in determining an age of the set of physical memory locations.

For some embodiments, the memory die comprises multiple aging bins that, where each aging bin is associated with (e.g., corresponding to) a different set of physical memory locations of the memory die. In this way, determining an age, refresh criterion, or a voltage level threshold for a given set of physical memory locations of the memory die can be determined based on a charge loss of the aging bin associated with the given set of physical memory locations. For some embodiments, the logic tracks multiple program-erase counts, with each tracking a count for a different set of physical memory locations of the memory die. The program-erase count for a given set of physical memory locations can be stored in an aging bin associated with the given set of physical memory locations.

After the memory die is powered on, at operation 204, the apparatus coupled to the memory die (e.g., 150, 160) causes a portion of preloaded data to be stored on the set of physical memory locations, where storage of the portion of preloaded data on the set of physical memory locations causing the program-erase count (associated with the set of physical memory locations) to be updated. The updates are based on the writes and erases performed on the set of physical memory locations to facilitate storage of the portion of preloaded data to the set of physical memory locations. Operation 204 can be performed as part of an operation that is causing the preloaded data to be stored across multiple sets of physical memory locations of the memory die. As noted herein, the preloaded data can include, without limitation, firmware data, operating system data, map data, software application data, and the like, which can be utilized by a device (e.g., computing device) that eventually uses the memory die. Operation 204 can be performed by way of a software application (e.g., memory die test software or the like) operating on a computing device, which can interact with the memory die through the apparatus and cause the storage of the preloaded data on the memory die.

Eventually, the apparatus causes the memory die (e.g., 150, 160) to power off at operation 206. After the memory die is powered off, the memory die can be solder mounted to a printed circuit board at operation 208. Depending on the embodiment, the memory die can be mounted to the printed circuit board by a reflow soldering process, and the memory die can be mounted on the printed circuit board at the same time as one or more other components (e.g., one or more other memory dies).

Figure 3:
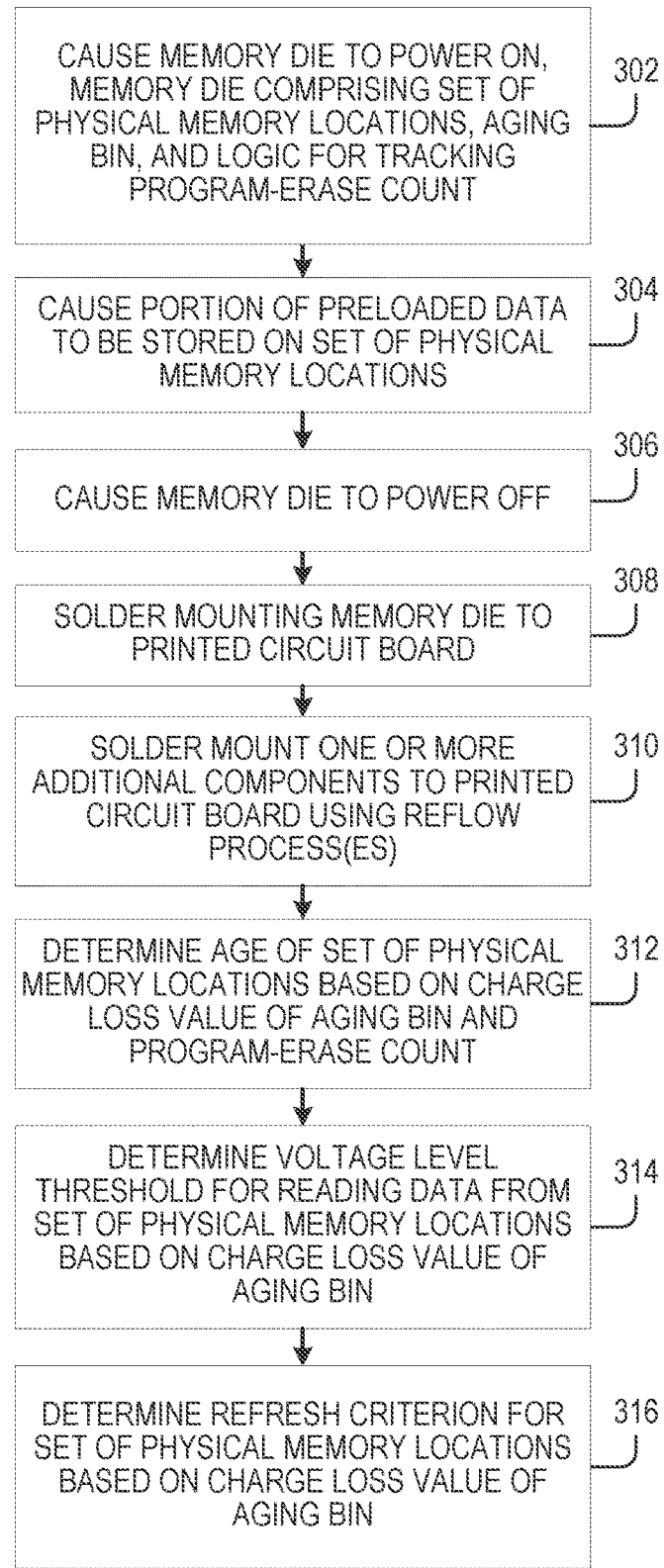

Referring now to the method 300 of FIG. 3, the method 300 illustrates an example of preparing a memory die (e.g., 150, 160) for age tracking, mounting the memory die to a printed circuit board (e.g., of 130, 140), and interacting with the memory die thereafter, in accordance with some embodiments. For some embodiments, the method 300 are performed as part of a manufacturing process that assembles one or more components with a printed circuit board (e.g., a memory device printed circuit board). For example, the method 300 can be performed by a party that manufactured the memory die, or can be performed by a downstream party, such as a party that receives a memory die (e.g., from a die manufacturer) and mounts the received memory die (and other components) onto a printed circuit board. Additionally, operations 312 through 316 of the method 300 can be performed as part of testing the printed circuit board, or testing a device that includes the printed circuit board. For some embodiments, operations 302 through 308 are respectively similar to operations 202 through 208 of the method 200 described with respect to FIG. 2.

At operation 310, an reflow apparatus (e.g., reflow oven) performs one or more reflow soldering processes on the printed circuit board (with the mounted memory die) to solder mount one or more additional components to the printed circuit board. For example, where the printed circuit board is a memory device (e.g., 130, 140) printed circuit board, operation 310 can be used to solder mount a controller on the memory device printed circuit board, such as a local media controller (e.g., 135).

At operation 312, a processing device (e.g., the processor 117 of the memory sub-system controller 115) determines, an age of the set of physical memory locations based on a charge loss value of the aging bin and further based on the program-erase count. For some embodiments, the processing device is operatively coupled to the printed circuit board (e.g., of the memory device 130, 140) on which the memory die (e.g., 150, 160) is solder mounted (by operation 308). Through the printed circuit board, the processing device can interact (e.g., communicate) with the memory die (e.g., 150, 160), which can enable operation 312 to be performed by the processing device. For some embodiments, determining the age by operation 312 comprises: measuring a current charge distribution of the aging bin; determining the charge loss value based on a difference between the current charge distribution and a reference charge distribution; and calculating the age of the set of physical memory locations based on the charge loss value and the program-erase count. For instance, the age can be calculated by multiplying the charge loss value by the program-erase count). The determined age of the set of physical memory locations can enable the processing device (e.g., the memory sub-system controller 115) to determine when the set of physical memory locations (e.g., one or more blocks of the memory die) would be likely to fail or be rendered defective.

For some embodiments, the program-erase count for the set of physical memory locations is stored on the (associated) aging bin, and the program-erase count is obtained by the processing device from the aging bin. For some embodiments, operation 312 comprises obtaining the program-erase count from the aging bin. Additionally, the program-erase count can be obtained from the aging bin as part of a handshake process between the memory die and the processing device (e.g., when the memory die initially powers on), during which the memory die can provide the processing device with one or more one or more program-erase counts for one more sets of physical memory locations of the memory die. Alternatively, the processing device can request the memory die to provide the program-erase count, and then receive the program-erase count in response to the request.

The reference charge distribution used (to be determine a charge loss value of an age bin) can be a charge distribution determined or measured (e.g., by the manufacturer of the memory die) through testing of the memory die or testing of another memory die that is similar to the memory die. For instance, during testing and prior to a reflow soldering process, the memory die or similar memory can be loaded with the preloaded data, which can cause updates of one or more program-erase counts of respective sets of physical memory locations that store the preloaded data, and cause the one or more program-erase counts. After the preloaded data is stored on the respective sets of physical memory locations, a reference charge distribution of the one or more aging bins can be measured and stored as data (e.g., reference charge distribution data), which can later be used (e.g., by the processing device) to determine a charge loss value for those one or more aging bins as described herein.

At operation 314, the processing device (e.g., 117) determines a voltage level threshold based on a charge loss value of the aging bin, where the voltage level threshold is used to read data from the set of physical memory locations. In particular, the voltage level threshold can comprise a voltage value (e.g., −100 mV) that determines whether a charge held by a physical memory location (e.g., electron charge held by a memory cell of a block) represents a stored binary value of 1 or 0. For instance, the voltage level threshold determined by operation 314 can be used by the processing device to read the portion of preloaded data stored on the set of physical memory locations (stored by operation 304). For some embodiments, once determined, the voltage level threshold is used to read data from the set of physical memory locations by applying (e.g., storing) the voltage level threshold setting associated with the set of physical memory locations.

For some embodiments, operation 314 comprises accessing pre-characterization data to obtain the voltage level threshold associated with the charge loss value of the aging bin, where the pre-characterization data describes associations between voltage level thresholds and charge loss values (e.g., maps charge loss value or a range of charge loss values to a voltage level thresholds). For various embodiments, the pre-characterization data is stored external to the memory die. For instance, the processing device can access the pre-characterization data from memory that is accessible to the processing device but different or separate from the memory die (e.g., stored on the local memory 119 of the memory sub-system controller 115). The pre-characterization data can be specifically associated with the memory die, or associated with memory dies similar to the memory die. The pre-characterization data can be provided by, for example, a manufacturer of the memory die. For some embodiments, the pre-characterization data is generated or collected based on testing of the memory die or testing of another memory die similar to the memory die. Such testing can be performed by a manufacturer of the memory die.

With respect to operation 316, the processing device (e.g., 117) determines a refresh criterion for the set of physical memory locations based on a charge loss value of the aging bin. For some embodiments, the processing device performs a refresh process on data (e.g., the portion of preloaded data) stored on the set of physical memory locations based on the refresh criterion. For instance, the refresh criterion can indicate that the refresh process should be performed on data, stored on the set of physical memory locations, at a rate of every 5 years, 4 years, 3, years, 2 years, 1 year, or immediately based on the charge loss value of the aging bin. For some embodiments, the formula for determining a refresh criterion can comprise subtracting a number reflow processes (e.g., cycles) from a charge retention specification of the memory die. The number of reflow soldering processes can be provided by pre-characterization data, which can describe an association between a given charge loss value and a number of reflow soldering processes. Depending on the embodiment, the refresh process can comprise copying and moving the stored data from the set of physical memory locations to another set of physical memory locations of the memory die. Performing the refresh process on one or more physical memory locations (e.g., a memory cells of a block) of the memory die can handle the natural deterioration of charges being held by those one or more physical memory locations. For some embodiments, to enable performance of refresh process on data stored on the set of physical memory locations, a voltage level threshold determined for the set of physical memory locations (by operation 314) is used by the refresh process to read the stored data from the set of physical memory locations and refresh the stored data (e.g., by copying and moving the stored data).

For some embodiments, operation 316 comprises accessing pre-characterization data to obtain the refresh criterion associated with the charge loss value of the aging bin, where the pre-characterization data describes associations between refresh criteria and charge loss values (e.g., maps charge loss value or a range of charge loss values to a refresh criterion). As described herein, the pre-characterization data can be stored external to the memory die (e.g., stored on the local memory 119 of the memory sub-system controller 115). The pre-characterization data can be specifically associated with the memory die, or associated with memory dies similar to the memory die. Additionally, the pre-characterization data can be provided by a manufacturer of the memory die, and can be generated or collected based on testing of the memory die or testing of another memory die similar to the memory die.

Figure 4:
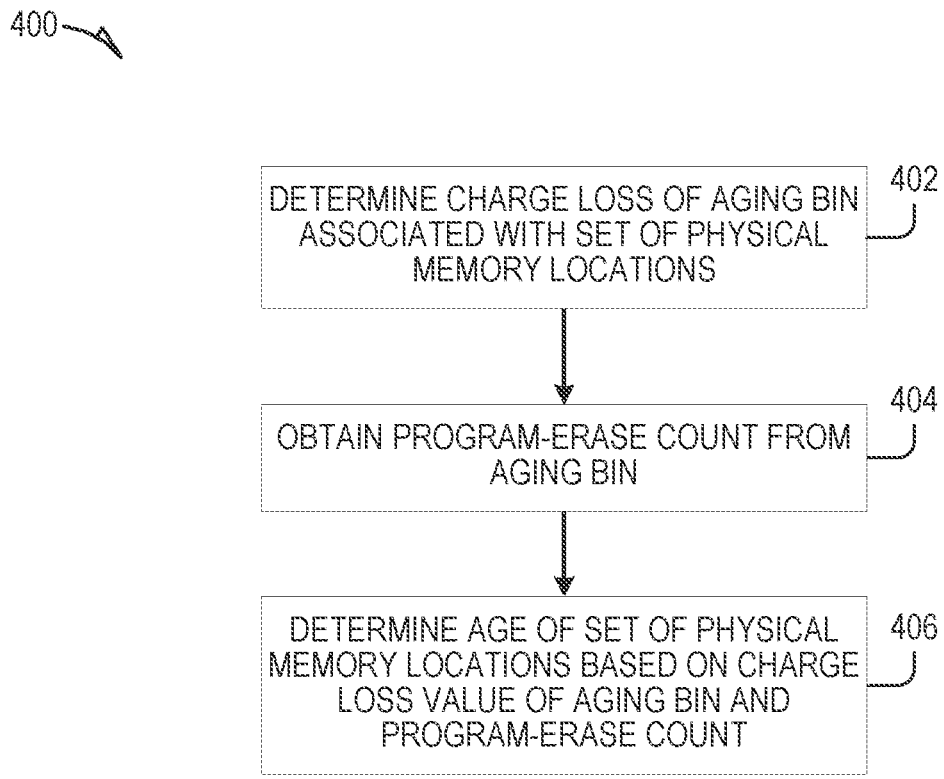

Referring now to the method 400 of FIG. 4, the method 400 illustrates an example of determining an age of a set of physical memory locations of a memory die based on age tracking, in accordance with some embodiments. At operation 402, a processing device (e.g., the processor 117 of the memory sub-system controller 115) determines a charge loss of an aging bin of a memory die (e.g., 150, 160), where the aging bin is associated with a set of physical memory locations of the memory die (e.g., 150, 160). For some embodiments, operation 402 comprises measuring a current charge distribution of the aging bin, and determining the charge loss value based on a difference between the current charge distribution and a reference charge distribution. For some embodiments, data (e.g., program-erase counts) stored on the aging bin, prior to the memory die being subjected to one or more reflow soldering processes, causes the aging bin to have a charge distribution prior to the one or more reflow soldering processes. As noted herein, one or more reflow soldering processes applied to the memory die can cause charge loss for the aging bin. As also noted herein, the reference charge distribution used (to be determine a charge loss value of an age bin) can be a charge distribution determined or measured (e.g., by the manufacturer of the memory die) through testing of the memory die or testing of another memory die that is similar to the memory die.

For some embodiments, the aging bin stores a program-erase count that describes a number of times data has been written to or erased from the set of physical memory locations prior to one or more reflow soldering processes being performed on the memory die. For various embodiments, the program-erase count is stored on the aging bin prior to the memory die being solder mounted on a printed circuit board (e.g., of the memory device 130, 140), where the memory die is operatively coupled to the memory die through the printed circuit board. For instance, the processing device can be mounted on the printed circuit board with the memory die (e.g., local media controller 135) or can be external to the printed circuit board (e.g., the memory sub-system controller 115). For some embodiments, the storage of the program-erase count on the aging bin provides the aging bin with a charge distribution (e.g., an initial charge distribution) prior to the memory die being subjected to one or more reflow soldering process.

The processing device (e.g., 117), at operation 404, obtains the program-erase count from the aging bin associated with the set of physical memory locations. For some embodiments, operation 404 is performed as part of a handshake process between the memory die and the processing device (e.g., when the memory die initially powers on), during which the memory die can provide the processing device with one or more one or more program-erase counts for one more sets of physical memory locations of the memory die. Alternatively, the processing device can request the memory die to provide the program-erase count, and then receive the program-erase count in response to the request.

At operation 406, the processing device (e.g., 117) determines the age of the set of physical memory locations based on the charge loss value (determined by operation 402) and further based on the program-erase count (obtained by operation 404). For some embodiments, operation 406 comprises: measuring a current charge distribution of the aging bin; determining the charge loss value based on a difference between the current charge distribution and a reference charge distribution; and calculating the age of the set of physical memory locations based on the charge loss value and the program-erase count. For instance, the age can be calculated by multiplying the charge loss value by the program-erase count). As noted herein, the determined age of the set of physical memory locations can enable the processing device (e.g., the memory sub-system controller 115) to determine when the set of physical memory locations (e.g., one or more blocks of the memory die) would be likely to fail or be rendered defective.

Figure 5:
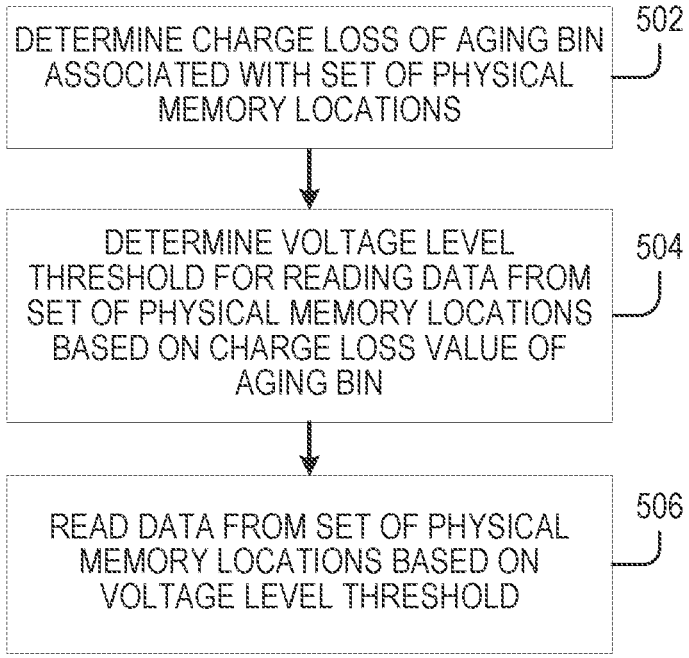

Referring now to the method 500 of FIG. 5, the method 500 illustrates an example of determining a voltage level threshold for read data from a set of physical memory locations of a memory die based on age tracking, in accordance with some embodiments. At operation 502, a processing device (e.g., the processor 117 of the memory sub-system controller 115) determines a charge loss of an aging bin of a memory die (e.g., 150, 160), where the aging bin is associated with a set of physical memory locations of the memory die (e.g., 150, 160). For some embodiments, operation 502 is similar to operation 402 of the method 400 described with respect to FIG. 4.

The processing device (e.g., 117), at operation 504, determines a voltage level threshold based on the charge loss value of the aging bin (determined by operation 502), where the voltage level threshold is used to read data from the set of physical memory locations. For some embodiments, the voltage level threshold is applied (e.g., stored) in association with the set of physical memory locations, which can enable the processing device to read data from the set of physical memory locations based on (e.g., using) the voltage level threshold.

For some embodiments, operation 504 comprises accessing pre-characterization data to obtain the voltage level threshold associated with the charge loss value of the aging bin, where the pre-characterization data describes associations between voltage level thresholds and charge loss values (e.g., maps charge loss value or a range of charge loss values to a voltage level thresholds). For various embodiments, the pre-characterization data is stored external to the memory die. For instance, the processing device can access the pre-characterization data from memory that is accessible to the processing device but different or separate from the memory die (e.g., stored on the local memory 119 of the memory sub-system controller 115). The pre-characterization data can be specifically associated with the memory die, or associated with memory dies similar to the memory die. The pre-characterization data can be provided by, for example, a manufacturer of the memory die. For some embodiments, the pre-characterization data is generated or collected based on testing of the memory die or testing of another memory die similar to the memory die. Such testing can be performed by a manufacturer of the memory die.

At operation 506, the processing device (e.g., 117) reads data, such as a portion of preloaded data, from the set of physical memory locations based on (e.g., using) the voltage level threshold determined by operation 504. As noted herein, the voltage level threshold can comprise a voltage value (e.g., −100 mV) that determines whether a charge held by a physical memory location (e.g., electron charge held by a memory cell of a block) represents a stored binary value of 1 or 0.

Figure 6:
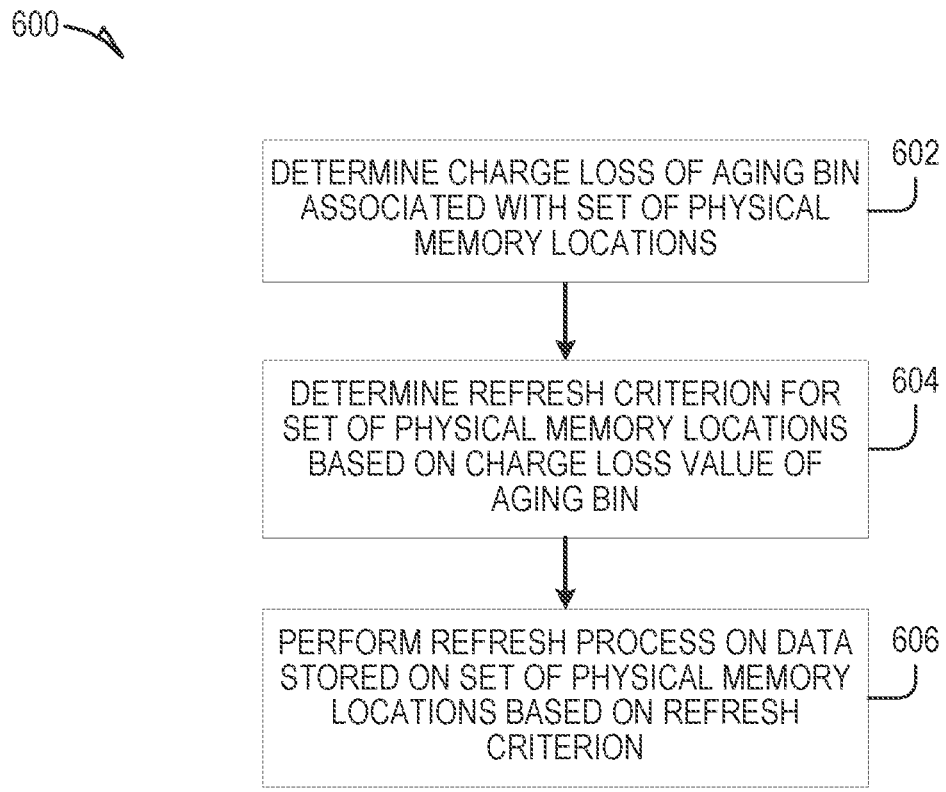

Referring now to the method 600 of FIG. 6, the method 600 illustrates an example of determining a refresh criterion for (refreshing data stored on) a set of physical memory locations of a memory die based on age tracking, in accordance with some embodiments. At operation 602, a processing device (e.g., the processor 117 of the memory sub-system controller 115) determines a charge loss of an aging bin of a memory die (e.g., 150, 160), where the aging bin is associated with a set of physical memory locations of the memory die (e.g., 150, 160). For some embodiments, operation 602 is similar to operation 402 of the method 400 described with respect to FIG. 4.

With respect to operation 604, the processing device (e.g., 117) determines a refresh criterion for the set of physical memory locations based on the charge loss value of the aging bin (determined by operation 602). For some embodiments, the processing device performs a refresh process on data (e.g., the portion of preloaded data) stored on the set of physical memory locations based on the refresh criterion. For instance, the refresh criterion can indicate that the refresh process should be performed on data, stored on the set of physical memory locations, at a rate of every 5 years, 4 years, 3, years, 2 years, 1 year, or immediately based on the charge loss value of the aging bin. For some embodiments, the formula for determining a refresh criterion can comprise subtracting a number reflow processes (e.g., cycles) from a charge retention specification of the memory die. The number of reflow soldering processes can be provided by pre-characterization data, which can describe an association between a given charge loss value and a number of reflow soldering processes. Depending on the embodiment, the refresh process can comprise copying and moving the stored data from the set of physical memory locations to another set of physical memory locations of the memory die. Performing the refresh process on one or more physical memory locations (e.g., a memory cells of a block) of the memory die can handle the natural deterioration of charges being held by those one or more physical memory locations.

For some embodiments, operation 604 comprises accessing pre-characterization data to obtain the refresh criterion associated with the charge loss value of the aging bin, where the pre-characterization data describes associations between refresh criteria and charge loss values (e.g., maps charge loss value or a range of charge loss values to a refresh criterion). As described herein, the pre-characterization data can be stored external to the memory die (e.g., stored on the local memory 119 of the memory sub-system controller 115). The pre-characterization data can be specifically associated with the memory die, or associated with memory dies similar to the memory die. Additionally, the pre-characterization data can be provided by a manufacturer of the memory die, and can be generated or collected based on testing of the memory die or testing of another memory die similar to the memory die.

At operation 606, the processing device (e.g., 117) performs a refresh process on data, such as a portion of preloaded data) stored on the set of physical memory locations based on the refresh criterion determined by operation 604.

Figure 7:
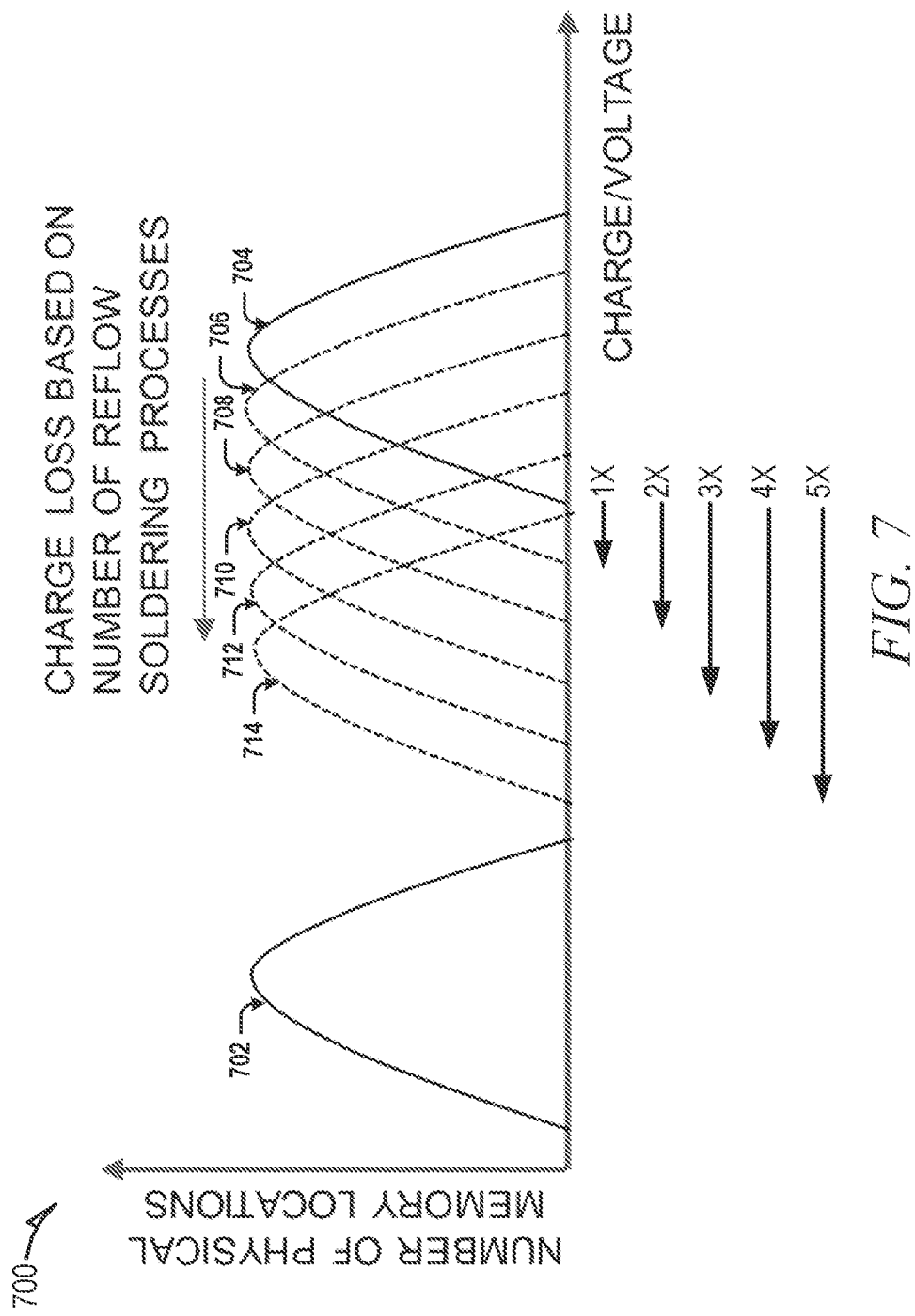
FIG. 7 is a chart illustrating example changes/voltage distributions of an aging bin of a memory die based on number reflow soldering processes applied to the memory die, in accordance with some embodiments of the present disclosure.

FIG. 7 is a chart 700 illustrating example changes/voltage distributions of an aging bin of a memory die based on number reflow soldering processes applied to the memory die, in accordance with some embodiments of the present disclosure. As shown, the chart 700 comprises curves 702 through 714, where each curve represents a charge/voltage distribution of the aging bin at a given moment in time. A given data point on any of the curves 702, 704, 706, 708, 710, 712, 714 can indicate a number of physical memory locations (e.g., memory cells) of the aging bin (e.g., comprising one or more SLC blocks) that have a measured charge/voltage value. Curve 702 can represent a charge/voltage distribution of the aging bin that represents that a set of physical memory locations, associated with the aging bin, is either in an erased state or otherwise unreadable (e.g., outside of a minimum voltage level defined by an operation specification for the memory die). In contrast, curve 704 can represent a charge/voltage distribution of the aging bin that represents that a set of physical memory locations, associated with the aging bin, is either in a programmed state (e.g., storing data) or otherwise readable. Curve 706 represents a charge/voltage distribution of the aging bin after one reflow soldering process has been applied to the memory die; curve 708 represents a charge/voltage distribution of the aging bin after two reflow soldering processes have been applied to the memory die; curve 710 represents a charge/voltage distribution of the aging bin after three reflow soldering processes have been applied to the memory die; curve 712 represents a charge/voltage distribution of the aging bin after four reflow soldering processes have been applied to the memory die; and curve 714 represents a charge/voltage distribution of the aging bin after five reflow soldering processes have been applied to the memory die.

Figure 8:
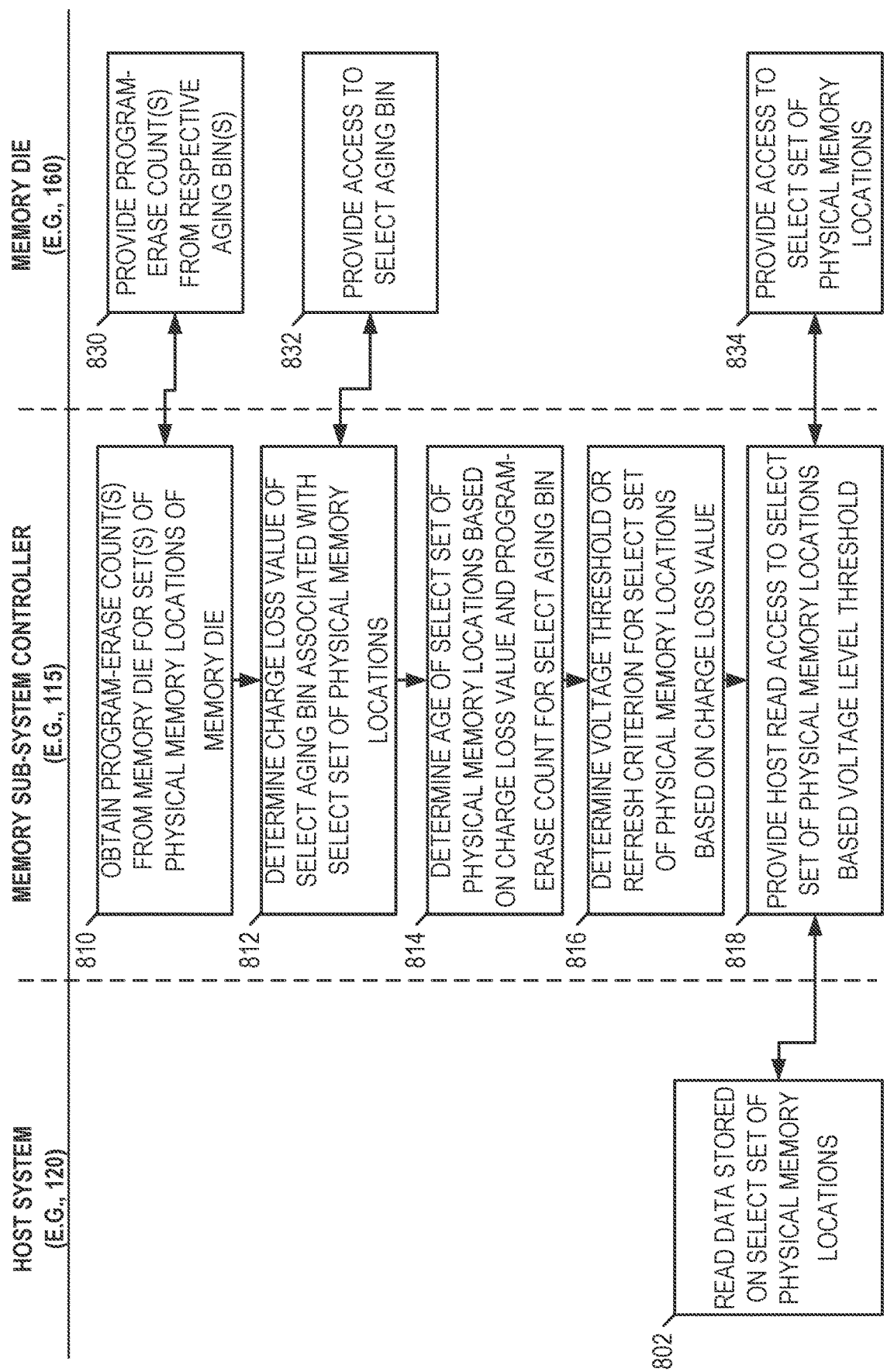
FIG. 8 provides an interaction diagram illustrating interactions between components of a computing environment in the context of some embodiments in which a method that uses age tracking of one or more physical memory locations of a memory die as described herein is performed.

FIG. 8 provides an interaction diagram illustrating interactions between components of a computing environment in the context of some embodiments in which a method that uses age tracking of one or more physical memory locations of a memory die as described herein is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., 120), a memory sub-system controller (e.g., 115), a memory die (e.g., 150 or 160), or some combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. In the context of the example illustrated in FIG. 8, the host system can include the host system 120, the memory sub-system controller can include the memory sub-system controller 115, and the memory die can include the memory die 160.

As shown in FIG. 8, at operation 810, the memory sub-system controller 115 obtains, from the memory die 160, one or more program-erase counts for one or more sets of physical memory locations of the memory die 160. To facilitate this, at operation 830, the memory die 160 provides the program-erase counts from one or more aging bins of the memory die 160, where those aging bins are associated with the sets of physical memory locations. The memory sub-system controller 115, at operation 812, determines a charge loss value of a select aging bin of the memory die 160, where the select aging bin is associated with a select set of physical memory locations of the memory die 160. For some embodiments, the select set of physical memory locations stores at least a portion of preloaded data, which was loaded (e.g., stored) on the select set of physical memory locations prior to the memory die 160 being subjected to one or more reflow soldering processes. Additionally, for some embodiments, the memory sub-system controller 115 determines the charge loss value by measuring a current charge distribution of the select aging bin. The memory die 160 enables such measurement by providing the memory sub-system controller 115 with access to the select aging bin at operation 832, which can permit the memory sub-system controller 115 to measure individual charges of the select aging bin. Alternatively, the memory die 160 can determine the current charge distribution of the select aging bin for the memory sub-system controller 115, and then provide the current charge distribution to the memory sub-system controller 115.

At operation 814, the memory sub-system controller 115 determines an age of the select set of physical memory locations based on the charge loss value and the program-erase count for the select aging bin. The age of the select set of physical memory locations can indicate to the memory sub-system controller 115 the likelihood of the select set of physical memory locations cam fail. Additionally, at operation 816, the memory sub-system controller 115 determines either a voltage level threshold, a refresh criterion, or both for the select set of physical memory locations. As described herein, the refresh criterion can be used by the memory sub-system controller 115 to preform refresh processes on data stored on the select set of physical memory locations.

As also described herein, the voltage level threshold can be used by the memory sub-system controller 115 to read data stored on the select set of physical memory locations. Accordingly, at operation 818, the memory sub-system controller 115 provides the host system 120 with read access, to data stored on the select set of physical memory locations, based on the voltage level threshold determined by operation 816. The memory die 160 provides the memory sub-system controller 115 with access to the select set of physical memory locations at operation 834. At operation 802, the host system 120 reads data stored on the select set of physical memory locations as provided by the memory sub-system controller 115. Operation 802 can comprise the host system 120: sending a request to the memory sub-system controller 115 data associated with a logical memory address (e.g., LBA) associated with the select set of physical memory locations; and receiving the requested data from the memory sub-system controller 115.

Figure 9:
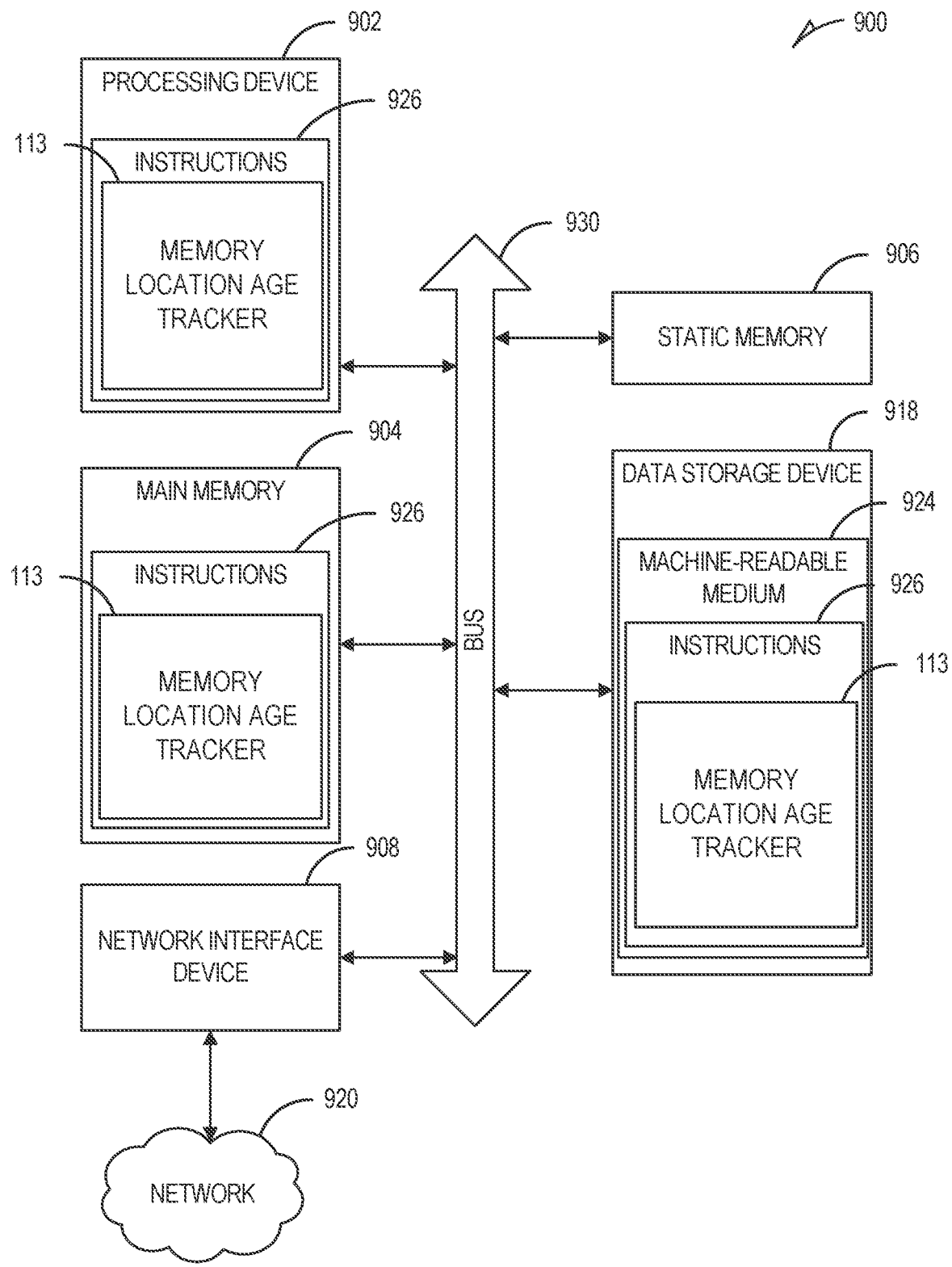
FIG. 9 is a block diagram of an example computer system in which embodiments of the present disclosure may operate.

FIG. 9 illustrates an example machine in the form of a computer system 900 within which a set of instructions can be executed for causing the machine to perform any one or more of the methodologies discussed herein. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage device 918, which communicate with each other via a bus 930.

The processing device 902 represents one or more general-purpose processing devices such as a microprocessor, a central processing unit, or the like. More particularly, the processing device 902 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 902 can also be one or more special-purpose processing devices such as an application-specific integrated circuit (ASIC), a field programmable gate array (FPGA), a digital signal processor (DSP), a network processor, or the like. The processing device 902 is configured to execute instructions 926 for performing the operations and steps discussed herein. The computer system 900 can further include a network interface device 908 to communicate over a network 920.

The data storage device 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage device 918, and/or main memory 904 can correspond to the memory sub-system 110 of FIG. 1.

In one embodiment, the instructions 926 include instructions to implement functionality corresponding to using memory location age tracking of a memory die as described herein (e.g., the memory location age tracker 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   while a memory die is powered on and after a portion of preloaded data is stored on a set of physical memory locations of the memory die, measuring a charge distribution of an aging bin to determine a reference charge distribution, the aging bin comprising one or more physical memory locations of the memory die that are different from the set of physical memory locations, the aging bin storing a program-erase count for the set of physical memory locations, the program-erase count describing a number of times data has been written to or erased from the set of physical memory locations;
   after the memory die is powered off, solder mounting the memory die to a printed circuit board; and
   after the printed circuit board is powered on:
   determining, by a processing device operatively coupled to the printed circuit board, a charge loss value of the aging bin based on a difference between a current charge distribution of the aging bin and the reference charge distribution;
   determining, by the processing device, a voltage level threshold for reading data from the set of physical memory locations, the voltage level threshold being determined based on the charge loss value; and
   reading, by the processing device, the portion of preloaded data from the set of physical memory locations based on the voltage level threshold.

2. The method of claim 1, comprising:
   after the memory die is solder mounted to the printed circuit board, solder mounting one or more components to the printed circuit board by performing at least one reflow soldering process on the printed circuit board.

3. The method of claim 1, comprising:
   after the printed circuit board is powered on:
   determining, by the processing device, an age of the set of physical memory locations based on the charge loss value of the aging bin and based on the program-erase count from the aging bin.

4. The method of claim 3, comprising:
   measuring the current charge distribution of the aging bin; and
   obtaining the program-erase count from the aging bin, the determining the age comprising: calculating the age of the set of physical memory locations by multiplying the charge loss value by the program-erase count.

5. The method of claim 1, wherein the determining of the voltage level threshold based on the charge loss value of the aging bin comprises:
   accessing pre-characterization data to obtain the voltage level threshold associated with the charge loss value, the pre-characterization data describing associations between voltage level thresholds and charge loss values.

6. The method of claim 1, comprising:
   after the printed circuit board is powered on:
   determining, by the processing device, a refresh criterion for the set of physical memory locations based on the charge loss value of the aging bin; and
   performing, by the processing device, a refresh process on data stored on the set of physical memory locations based on the refresh criterion.

7. The method of claim 6, wherein the determining of the refresh criterion for the set of physical memory locations based on the charge loss value of the aging bin comprises:
   accessing pre-characterization data to obtain the refresh criterion associated with the charge loss value, the pre-characterization data describing associations between refresh criteria and charge loss values.

8. The method of claim 1, wherein the one or more physical memory locations of the aging bin comprises one or more single-level cell (SLC) blocks.

9. The method of claim 1, wherein the aging bin being part of a plurality of aging bins of the memory die, each aging bin of the plurality of aging bins being associated with a different set of physical memory locations and storing an individual program-erase count for the different set of physical memory locations.

10. A system comprising:
    a memory die comprising:
    a set of physical memory locations storing pre-loaded data; and
    an aging bin comprising one or more physical memory locations of the memory die that are different from the set of physical memory locations, and the aging bin storing a program-erase count describing a number of times data has been written to or erased from the set of physical memory locations; and
    a processing device operatively coupled to the memory die, the processing device configured to perform operations comprising:
    determining a charge loss value of the aging bin based on a difference between a current charge distribution of the aging bin and a reference charge distribution, the reference charge distribution being measured prior to the memory die being solder mounted to a printed circuit board;
    determining a voltage level threshold for reading data from the set of physical memory locations, the voltage level threshold being determined based on the charge loss value; and
    reading a portion of preloaded data from the set of physical memory locations based on the voltage level threshold.

11. The system of claim 10, wherein the program-erase count being stored on the aging bin prior to the memory die being solder mounted on the printed circuit board.

12. The system of claim 10, wherein the operations comprise:
    determining the age of the set of physical memory locations based on the charge loss value and based on the program-erase count.

13. The system of claim 12, wherein the operations comprise:
    measuring the current charge distribution of the aging bin; and
    obtaining the program-erase count from the aging bin, the determining the age comprising:
    calculating the age of the set of physical memory locations by multiplying the charge loss value by the program-erase count.

14. The system of claim 10, wherein the determining of the voltage level threshold based on the charge loss value comprises:

accessing pre-characterization data to obtain the voltage level threshold associated with the charge loss value, the pre-characterization data describing associations between voltage level thresholds and charge loss values.

15. The system of claim 10, wherein the operations comprise:

determining a refresh criterion for the set of physical memory locations based on the charge loss value; and performing a refresh process on data stored on the set of physical memory locations based on the refresh criterion.

16. The system of claim 15, wherein the determining of the refresh criterion for the set of physical memory locations based on the charge loss value comprises:

accessing pre-characterization data to obtain the refresh criterion associated with the charge loss value, the pre-characterization data describing associations between refresh criteria and charge loss values.

17. The system of claim 10, wherein the determining of the charge loss value of the aging bin comprises:

measuring a current charge distribution of the aging bin.

18. The system of claim 13, wherein the obtaining of the program-erase count comprising:

receiving the program-erase count from the memory die as part of a handshake process performed between the processing device and the memory die.

19. At least one non-transitory machine-readable storage medium comprising instructions that, when executed by a processing device, cause the processing device to perform operations comprising:

determining a charge loss value of an aging bin of a memory die based on a difference between a current charge distribution of the aging bin and a reference charge distribution, the aging bin comprising one or more physical memory locations of the memory die that are different from a set of physical memory locations of the memory die, the reference charge distribution being measured prior to the memory die being solder mounted to a printed circuit board;

determining a voltage level threshold based on the charge loss value, the voltage level threshold for reading data from the set of physical memory locations;

reading data from the set of physical memory locations based on the voltage level threshold;

determining a refresh criterion for the set of physical memory locations based on the charge loss value; and performing a refresh process on data stored on the set of physical memory locations based on the refresh criterion.

20. The at least one non-transitory machine-readable storage medium of claim 19, wherein the determining of the voltage level threshold based on the charge loss value comprises:

accessing pre-characterization data to obtain the voltage level threshold associated with the charge loss value, the pre-characterization data describing associations between voltage level thresholds and charge loss values.

* * * * *